United States Patent
Uchida

(10) Patent No.: US 7,880,597 B2
(45) Date of Patent: Feb. 1, 2011

(54) HYBRID VEHICLE BATTERY INFORMATION DISPLAY DEVICE

(75) Inventor: Masatoshi Uchida, Toyota (JP)

(73) Assignee: Toyota Jidosha Kabushiki Kaisha, Aichi-Ken (JP)

( * ) Notice: Subject to any disclaimer, the term of this patent is extended or adjusted under 35 U.S.C. 154(b) by 58 days.

(21) Appl. No.: 12/090,339

(22) PCT Filed: Mar. 27, 2007

(86) PCT No.: PCT/JP2007/057348
§ 371 (c)(1),
(2), (4) Date: Apr. 15, 2008

(87) PCT Pub. No.: WO2007/114410
PCT Pub. Date: Oct. 11, 2007

(65) Prior Publication Data
US 2009/0040033 A1 Feb. 12, 2009

(30) Foreign Application Priority Data
Mar. 31, 2006 (JP) ............................. 2006-096997

(51) Int. Cl.
*B60Q 1/00* (2006.01)
(52) U.S. Cl. ................. 340/439; 340/636.15; 340/662; 340/525
(58) Field of Classification Search ................. 340/439, 340/635, 636.1, 636.15, 440–441, 455, 525, 340/636.19, 636.17, 648, 660, 669, 662–663, 340/693.2, 450.2–450.3
See application file for complete search history.

(56) References Cited

U.S. PATENT DOCUMENTS

| | | | | |
|---|---|---|---|---|
| 4,335,429 A | * | 6/1982 | Kawakatsu | 701/102 |
| 4,489,242 A | * | 12/1984 | Worst | 307/10.1 |
| 6,232,743 B1 | * | 5/2001 | Nakanishi | 320/104 |
| 6,424,157 B1 | * | 7/2002 | Gollomp et al. | 324/430 |
| 6,784,640 B2 | | 8/2004 | Mizuta et al. | |
| 6,836,122 B2 | | 12/2004 | Tojima | |

(Continued)

FOREIGN PATENT DOCUMENTS

CN    1439887 A    9/2003

(Continued)

OTHER PUBLICATIONS

Chinese Office Action for corresponding Chinese Patent Application No. 2010070900266310 issued on Jul. 14, 2010.

*Primary Examiner*—Daniel Previl
(74) *Attorney, Agent, or Firm*—Sughrue Mion, PLLC

(57) ABSTRACT

A hybrid vehicle battery information display device 1 includes a battery service life display unit 2 which estimates a degree of battery degradation with respect to a useful life of a battery 16 from data on vehicle travel and the like based on battery degradation data measured from a vehicle travel test 19, to display information on a battery service life; a travel fuel consumption display unit 3 which evaluates, from the vehicle travel test 19, a degradation degree of actual travel fuel consumption data due to the battery degradation for each drive pattern based on test travel fuel consumption data set for each drive pattern, to display information on a travel fuel consumption; and a display control unit 4 which controls the display of information on the battery service life.

11 Claims, 12 Drawing Sheets

U.S. PATENT DOCUMENTS

| | | |
|---|---|---|
| 6,932,174 B2 | 8/2005 | Hirata et al. |
| 2003/0094321 A1* | 5/2003 | Hirata et al. ............... 180/65.2 |
| 2003/0155810 A1* | 8/2003 | Mizuta et al. ............... 307/10.1 |
| 2007/0018608 A1 | 1/2007 | Okumura |

FOREIGN PATENT DOCUMENTS

| | | |
|---|---|---|
| DE | 3706076 A1 | 9/1988 |
| JP | 10-004601 A | 1/1998 |
| JP | 10-004603 A | 1/1998 |
| JP | 2000-100477 A | 4/2000 |
| JP | 2002-102429 A | 4/2002 |
| JP | 2002-274219 A | 9/2002 |
| JP | 2003-164006 A | 6/2003 |
| JP | 2003-217682 A | 7/2003 |
| JP | 2003-244802 A | 8/2003 |
| JP | 2003264906 A | 9/2003 |
| JP | 2003-297435 A | 10/2003 |
| JP | 2004-072927 A | 3/2004 |
| JP | 2004193003 A | 7/2004 |
| WO | 2005/003799 A2 | 1/2005 |

* cited by examiner

HYBRID VEHICLE BATTERY INFORMATION DISPLAY DEVICE

This is a 371 of Application No. PCT/JP2007/057348 filed Mar. 27, 2007, claiming the priority of JP2006-096997 filed Mar. 31, 2006 which is hereby incorporated by reference.

TECHNICAL FIELD

The present invention relates to a hybrid vehicle battery information display device. More particularly, it relates to a device arranged on an operation board of a hybrid vehicle in which a battery is carried as a power source, to display information related to the service life of the battery.

BACKGROUND ART

A hybrid vehicle is a vehicle on which a hybrid power system is provided. Such a hybrid system is a system in which two types of power sources, such as a gasoline engine and an electric motor, are combined and used.

Characteristics of the hybrid system lie in that the gasoline engine and the electric motor are selectively used in accordance with travel conditions of the vehicle and that advantages of each are used to compensate for weak points of the other.

Moreover, a hybrid vehicle using a gasoline engine and an electric motor together as the power sources can be operated using an engine having a smaller engine displacement than that of a comparable conventional vehicle (ICE) using the gasoline engine as the only power source.

Furthermore, in such a hybrid vehicle, the electric motor functions as a power generator during deceleration, and regenerative braking is performed by converting kinetic energy of the vehicle into electric energy when braking. This converted electric energy is stored in the battery and reused during acceleration and the like. Therefore, as the vehicle is operated the battery used in the hybrid vehicle is repeatedly discharged during the acceleration or the like and charged by the regenerative braking during the deceleration.

As the hybrid vehicle battery carried as the power source degrades over time during use, it thus has a finite service life. This occurs because, when the vehicle is operated for long periods of time, the inner resistance of the battery rises, and cell charge and discharge capabilities (battery capacity) gradually degrade. As such, it is imperative that accurate information on the state of the battery in the hybrid vehicle can be readily obtained.

Factors which influence the degradation of the battery over the elapse of time mainly include vehicle specifications data, battery environment, power consumption of electric components, and the traveling of the vehicle. The vehicle specification data is concerned with vehicle type and the like of the vehicle, and examples of such information include the vehicle model, the vehicle weight, and facility specifications. Here, facility specifications are, for example, types and capacities of the engine and electric components such as an air conditioner installed on the vehicle. The vehicle type and the facility specifications of the vehicle concern the power consumption of the battery of the vehicle, and are therefore factors which influence the degradation of the battery. The battery environment is the environment wherein the battery itself is disposed, and examples include temperature of the battery, atmospheric temperature, and humidity. Over-discharge and overcharge of the battery hasten degradation of the battery, and are therefore factors which influence degradation of the battery (battery life). Examples of the electric components which effect the power consumption include a power-consuming air conditioner or audio system installed on the vehicle. These electric components consume the power stored in the battery, and therefore they are factors which influence the degradation of power. Furthermore, vehicle travel is concerned with, for example, the travel distance and a driving operation of the vehicle. In general, because the degradation of the battery tends to increase with the distance traveled by the vehicle, vehicle travel is a factor which influences the degradation of the battery. The influence on the degree of the degradation of the battery also varies according to the driving habits of the vehicle operator.

Meanwhile, battery degradation can lead to collapse of the balance of optimum selective use of the gasoline engine and the electric motor, with the result that the burden on the gasoline engine increases. That is, deterioration of capability due to the degradation of the battery over time occurs in the electric motor which should originally function as the power source, and automatic control is performed so as to compensate for the capability deterioration by greater reliance on the gasoline engine. As a result, the vehicle travels with the engine having a smaller displacement as compared with the same type of conventional vehicle, so that a travel fuel consumption of the gasoline decreases.

This increase of fuel efficiency is more remarkable in driving including greater cornering, lane changes, and starting or stopping than in a drive pattern of traveling at a constant speed, that is, normal travel. This occurs because, owing to the combined use of the gasoline engine and the electric motor, the hybrid system more effectively uses the power source in a drive pattern including cornering, lane changes, and starting or stopping. On the other hand, during normal travel, the vehicle mainly travels under power of the gasoline engine, and hence the decrease in the travel fuel consumption is about the same as in the drive operation of the conventional vehicle. The characteristics of the hybrid system are such that the travel fuel consumption varies according to driving patterns, for example, travel speed or travel route of the vehicle, or the operation of the driver.

Moreover, with regard to the travel fuel consumption of the conventional hybrid vehicle, for example, an average fuel consumption, a momentary fuel consumption, a total fuel consumption, a past maximum fuel consumption, and the like may be measured and displayed. The display of these fuel consumption values begins when the ignition switch is turned on. For example, for the average fuel consumption and the momentary fuel consumption, an average fuel consumption for each minute and a momentary fuel consumption (over approximately 30 minutes) are displayed. In case of the total fuel consumption, a total fuel consumption from a data reset operation up to that point is displayed, and in case of the past maximum fuel consumption, the maximum value between reset operations of the total fuel consumption display is displayed.

On the other hand, an electric car battery display device for displaying information concerning the degradation of a battery is disclosed in Japanese Patent Application Laid-Open No. 10-4603, and a vehicle travel state display device for displaying information concerning fuel consumption is disclosed in Japanese Patent Application Laid-Open No. 2002-274219.

FIG. 11 shows an electric car battery display device as disclosed in Japanese Patent Application Laid-Open No. 10-4603. A display device 51 provided near the driver seat is constituted by a degradation display section 52 indicating a state in which the battery should be replaced and a charge display section 53 which displays information indicating whether or not the battery state is satisfactory. The degradation display section 52 has a display portion 54 divided into zones of a state G (green) in which the battery is not degraded, a state Y (yellow) in which it is advised that an inspection be made, a state R (red) in which battery replacement is advised, and a state E (a red lamp lights or blinks) in which the battery must be replaced, and an indicator 56 is positioned in a zone, depending on the state of the battery, to display the state of the battery degradation. The charge display section 53 has a display portion 55 divided into zones of a state G (green) indicating normal use and a state R (red) in which charging must be performed, and an indicator 57 is positioned in a zone, depending on the state of the charging, to display the state of the charging of the battery.

FIG. 12 shows a travel state display device of a vehicle as disclosed in Japanese Patent Application Laid-Open No. 2002-274219. In display means 60, a fuel consumption display section 61, an energy breakdown display section 62, and an accumulated energy display section 63 are displayed. In the fuel consumption display section 61, a kinetic energy correspondence fuel consumption 65 and a positional energy correspondence fuel consumption 66 are stacked on an apparent fuel consumption 64, and displayed as a bar graph. In the energy breakdown display section 62, breakdowns of absorption energy 67 by a brake and regeneration energy 68 by a motor are displayed as a bar graph. The accumulated energy display section 63 displays therein a total accumulated amount 69 of the kinetic energy and the positional energy, vertical bar graphs of an accumulated amount 70 of electric energy, and arrows 71, 72, 73 and 74 indicating states of the energy.

DISCLOSURE OF THE INVENTION

A driver operating a hybrid vehicle cannot easily recognize that the service life and efficiency of a battery are higher than a gasoline power source. This is because a hybrid system is a system in which the power source is effectively used by combined use of a gasoline engine and an electric motor, and hence it is a more complicated system as compared with a conventional vehicle in which the gasoline engine is used as the power source. On the other hand, the ordinary driver understands and has interest in gasoline consumption and fuel efficiency, and therefore normally appropriately recognizes their display. Therefore, to provide information on the service life and efficiency of the battery, a means of providing information different from the means for providing information on gasoline and fuel consumption is required.

When the battery degrades over time, a problem occurs that fuel efficiency of the vehicle decreases. This is because in general, the size of the gasoline engine of the hybrid vehicle is smaller than that of ordinary internal combustion vehicles. In consequence, there is lost a feature of the hybrid vehicle that its travel fuel efficiency is higher than that of a conventional vehicle. An accident might be generated in which the vehicle cannot travel owing to expiry of the service life of the battery in the course of long-distance drive. Therefore, a display technique which enables a driver to appropriately recognize the information is required.

Moreover, it is unlikely that the driver of a hybrid vehicle would ever pay more attention to the battery than the gasoline power source. One reason for this is that the engine operates as an electricity supply source so as to maintain a constant charge state during travel of the hybrid vehicle, and, hence, charging from an external source is not required. Drivers having little experience driving hybrid vehicles will often operate the vehicle without paying attention to the battery condition for a long period, until a time for replacing the battery comes. Furthermore, the fact that the replacement interval of the battery is much longer than that of refueling with gasoline is a factor contributing to drivers ignoring the state of the battery.

Various devices to display the information on the battery of the hybrid vehicle with respect to the driver have been suggested, such as those disclosed in Japanese Patent Applications Laid-Open Nos. 10-4603, 2002-274219, and the like. However, because the driver initially tends to ignore the battery condition as described above, the information on the battery is not appropriately recognized when displayed only as a gauge or bar graph. That is, because the information on the battery is not normally understood by the driver, the driver recognizes the gauge as a gauge of little importance among the many gauges on the dashboard. Therefore, display to improve the driver's attention to the battery is demanded.

The present application provides a display device which enables a driver of a hybrid vehicle to appropriately recognize information on a battery, whereby attention to the battery can be enhanced.

A battery information display device for the hybrid vehicle according to the present invention has the following characteristics.

(1) To achieve the above object, a hybrid vehicle battery information display device according to the present invention is a hybrid vehicle battery information display device arranged on a drive operation board of a hybrid vehicle in which a battery is carried as a power source, to display information on a service life of the battery, the device comprising: battery service life display means for estimating a degree of degradation of the battery with respect to a useful life of the battery from environment data on the battery, power consumption data on electric components and data on vehicle travel, which have been measured based on battery degradation data measured from a vehicle travel test, to display a level of warning on the service life of the battery and information on a remaining service life of the battery; and service life display control means for controlling the level of the warning on the service life of the battery and the information on the remaining service life of the battery to display the level and the information in the battery service life display means.

(2) Moreover, in the hybrid vehicle battery information display device, it is preferable that the battery service life display means displays the level of the warning on the service life of the battery by use of a screen which shows a hybrid system.

(3) Furthermore, in the hybrid vehicle battery information display device, it is preferable that the battery service life display means displays the information on the remaining service life of the battery together with a screen which displays the battery.

(4) In addition, it is preferable that the hybrid vehicle battery information display device includes travel fuel consumption display means for evaluating, from the vehicle travel test, a degradation degree of an actual travel fuel consumption due to the degradation of the battery for each drive pattern based on test travel fuel consumption data set for each drive pattern, to display the level of the warning on the degradation degree of the travel fuel consumption due to the degradation of the battery for each drive pattern and information on the degradation degree of the travel fuel consumption due to the degradation of the battery for each drive pattern; and fuel consumption display control means for controlling the level of the warning on the degradation degree of the travel fuel consumption due to the degradation of the battery for each drive pattern and the information on the degradation degree of the travel fuel consumption due to the degradation of the battery for each drive pattern, to display the level and the information in the travel fuel consumption display means.

(5) Moreover, in the hybrid vehicle battery information display device, it is preferable that the travel fuel consumption display means displays the level of the warning on the degradation degree of the travel fuel consumption due to the degradation of the battery for each drive pattern by use of a screen which shows a hybrid system.

(6) Furthermore, in the hybrid vehicle battery information display device, it is preferable that the travel fuel consumption display means displays the information on the degradation degree of the travel fuel consumption due to the degradation of the battery for each drive pattern together with a screen which shows the drive pattern. It is preferable that this drive pattern includes cornering of the vehicle, lane change of the vehicle, starting of the vehicle, and deceleration of the vehicle.

(7) In addition, in the hybrid vehicle battery information display device, it is preferable that the service life display control means allows the service life display means to switch a screen which displays the level of the warning on the service life of the battery and a screen which displays the information on the remaining service life of the battery and that the fuel consumption display control means allows the travel fuel consumption display means to switch a screen which displays the level of the warning on the degradation degree of the travel fuel consumption due to the degradation of the battery for each drive pattern and a screen which displays the information on the degradation degree of the travel fuel consumption for each drive pattern.

(8) Moreover, in the hybrid vehicle battery information display device, it is preferable that the screen of the battery service life display means which displays the level of the warning on the service life of the battery and the screen of the travel fuel consumption display means which displays the level of the warning on the degradation degree of the travel fuel consumption due to the degradation of the battery for each drive pattern are initial screens.

(9) Furthermore, in the hybrid vehicle battery information display device, it is preferable that the level of the warning is distinguished by colors and that the colors are green, yellow and red.

BEST MODE FOR CARRYING OUT THE INVENTION

Embodiments of the present invention will hereinafter be described in detail with reference to the drawings.

Figure 1:
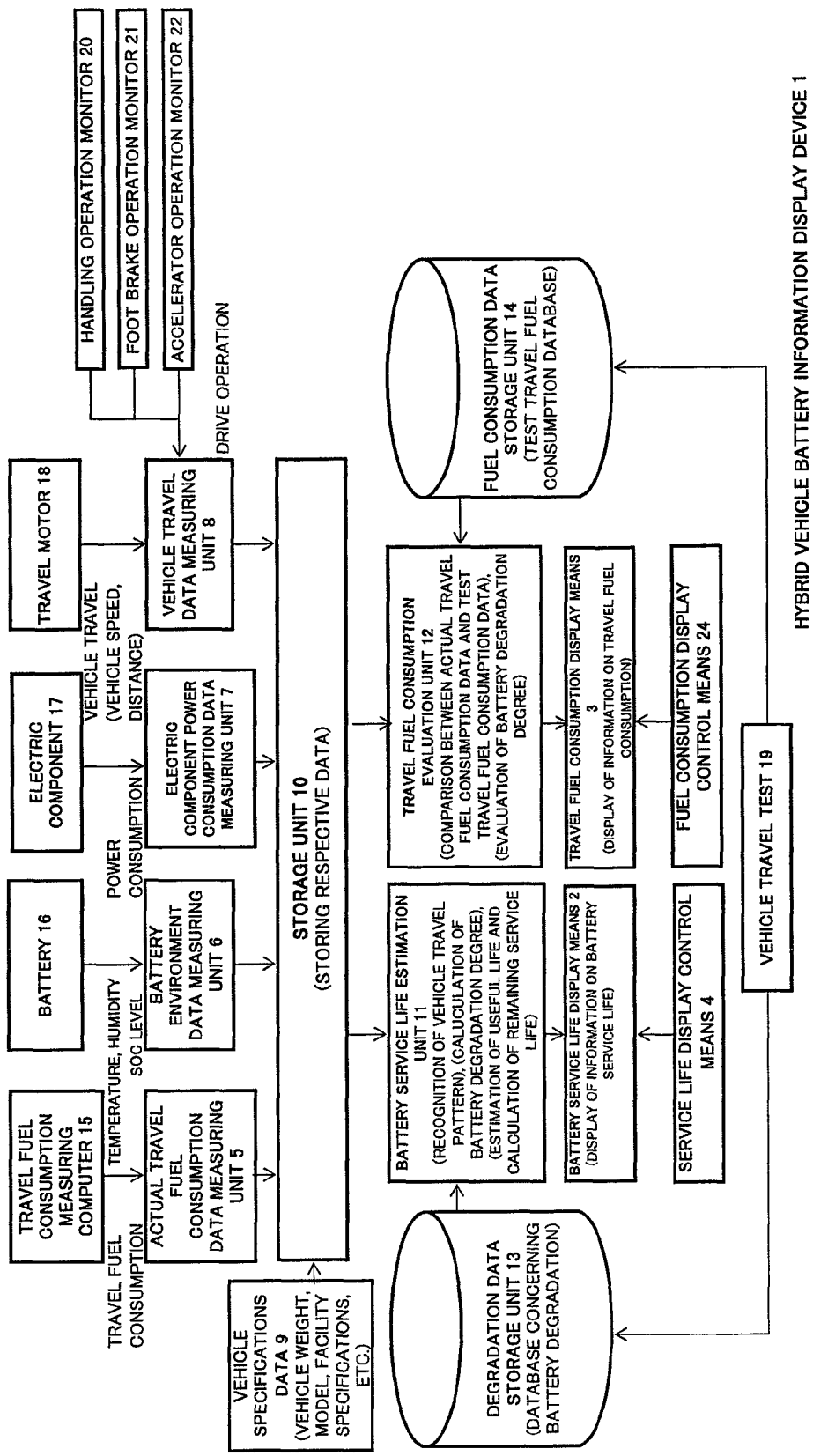
FIG. 1 is a block diagram showing a schematic constitution of one embodiment of a hybrid vehicle battery information display device according to the present invention.

FIG. 1 shows a block diagram of a schematic constitution of one embodiment of a hybrid vehicle battery information display device 1. This battery information display device 1 is constituted by battery service life display means 2, travel fuel consumption display means 3, service life display control means 4, and fuel consumption display control means 24. Here, a battery supplies power to an inverter for driving and controlling a travel motor 18 and which has a high pressure of 144 V to 288 V.

(Battery Service Life Display Means)

The battery service life display means 2 displays information on a service life of the battery 16. In the present embodiment, this display includes two types of means: first display means for displaying a level of warning on the service life of the battery 16; and second display means for displaying a remaining service life of the battery 16.

Figure 2:
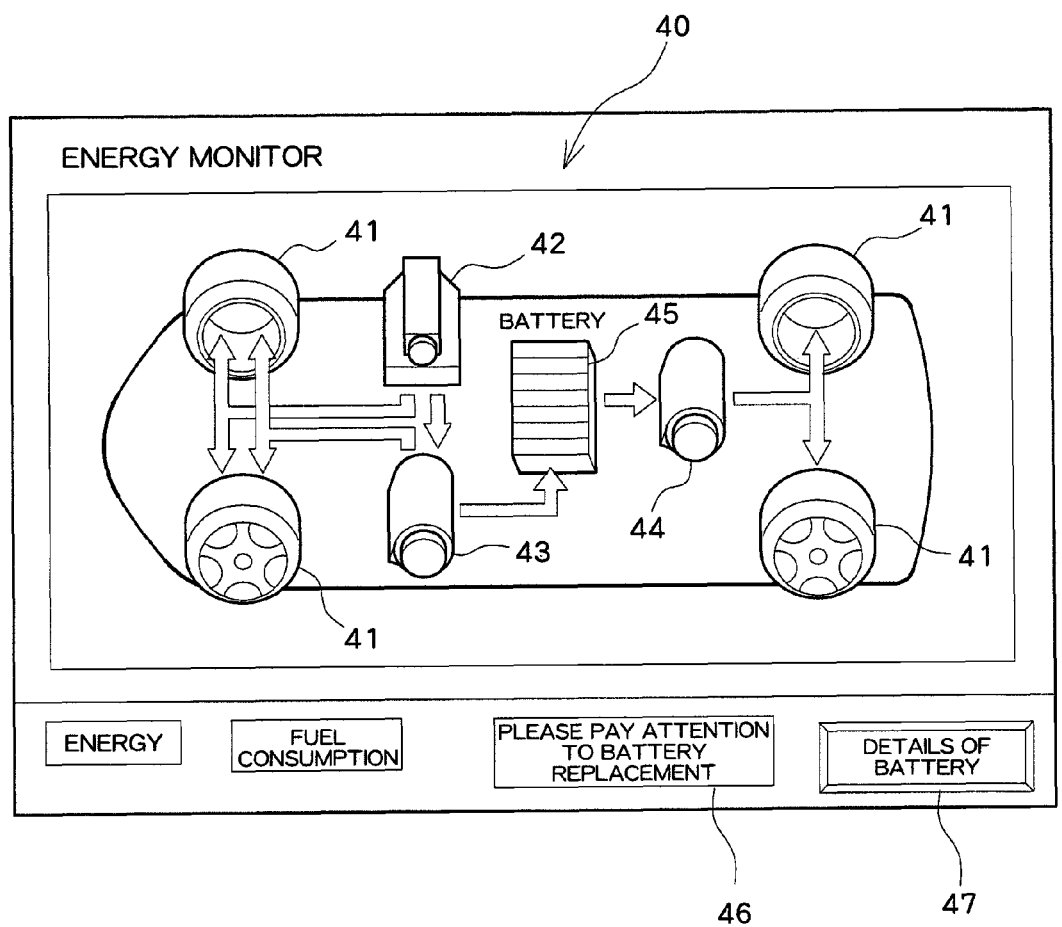
FIG. 2 is an explanatory view showing one embodiment of first display means of battery service life display means.

FIG. 2 shows one embodiment of the first display means of the battery service life display means 2. In the present embodiment, the first display means of the battery service life display means 2 is displayed in an energy monitor screen 40 which shows a hybrid system. The energy is monitor screen 40 simplifies the hybrid system to show the system in a bird's-eye view, and is a screen which graphically displays, for a driver, a transmission direction of energy, the present driving method, a power generating situation by an engine 42, a use situation of regenerative energy and rotation of tires 41 owing to travel. In the screen of the present embodiment, the tires 41 of a vehicle, the engine 42, a front motor 43, a rear motor 44 and a battery (cell) 45 are shown, but other energy elements may be included.

With regard to the first display means, in a frame of the diagram showing the battery (cell) 45 in this energy monitor screen 40, the color of a display changes to green (battery replacement is not required), yellow (caution to pay attention to the battery replacement), or red (battery replacement is required) in accordance with the battery service life warning state. Moreover, a column of a message 46 of the warning is disposed outside the frame of the energy monitor screen 40, and contents of the warning are displayed in accordance with the color of the battery (cell) 45. When the color is green, a message "battery replacement is not required" is displayed. In the case of yellow, a message "please pay attention to the battery replacement" is displayed. In the case of red, a message "please replace the battery" is displayed. The information on the battery service life is displayed in the energy monitor screen 40 in this manner, whereby the driver can comprehend an outline of the hybrid system. Moreover, the level of the warning is displayed using colors, so that the driver can appropriately recognize the information concerning the battery 16. Furthermore, the message is displayed even when the battery does not require replacement in order to enhance the driver's level of attention to the state of the battery 16.

Figure 3:
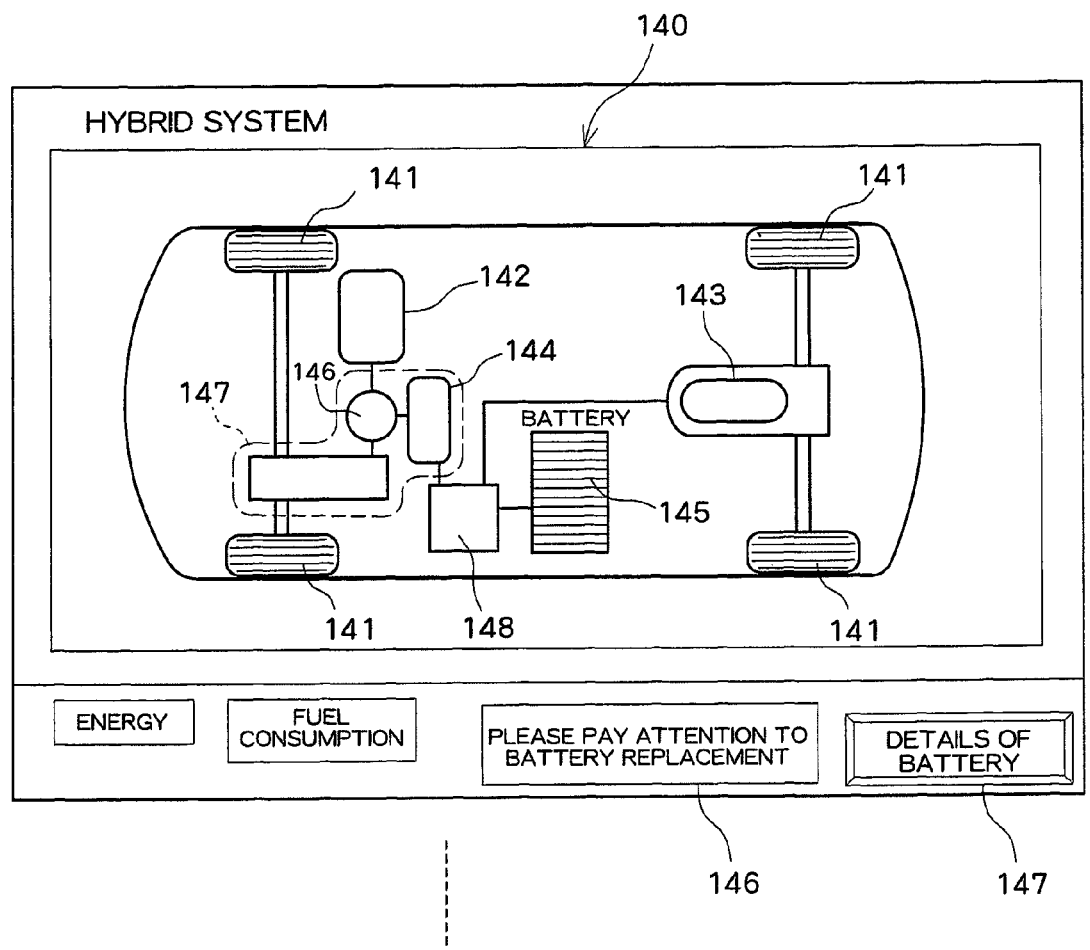
FIG. 3 is an explanatory view showing another embodiment of the first display means of the battery service life display means.

FIG. 3 shows another embodiment of the first display means. In the present embodiment, a constitution of a hybrid system is used as a screen which shows the hybrid system. Even in the present embodiment, in a frame of a diagram showing a battery (cell) 145 in a constitution screen 140 of the hybrid system, the color of a displayed image changes from green, to yellow or red in accordance with a level of warning regarding the battery service life. Moreover, a column showing a message 146 of the warning is provided outside the frame of the constitution screen 140 of the hybrid system, and the content of warnings are displayed here in correlated with the color of the battery (cell) 145. The screen of the present embodiment shows tires 141 of a vehicle, an engine 142, a transformer axle (rear) 143, a motor generator 144, the battery (cell) 145, a power switch mechanism 146, a transformer axle (front) 147, and an inverter 148 provided with a converter, but other elements concerning the hybrid system may be included.

Figure 4:
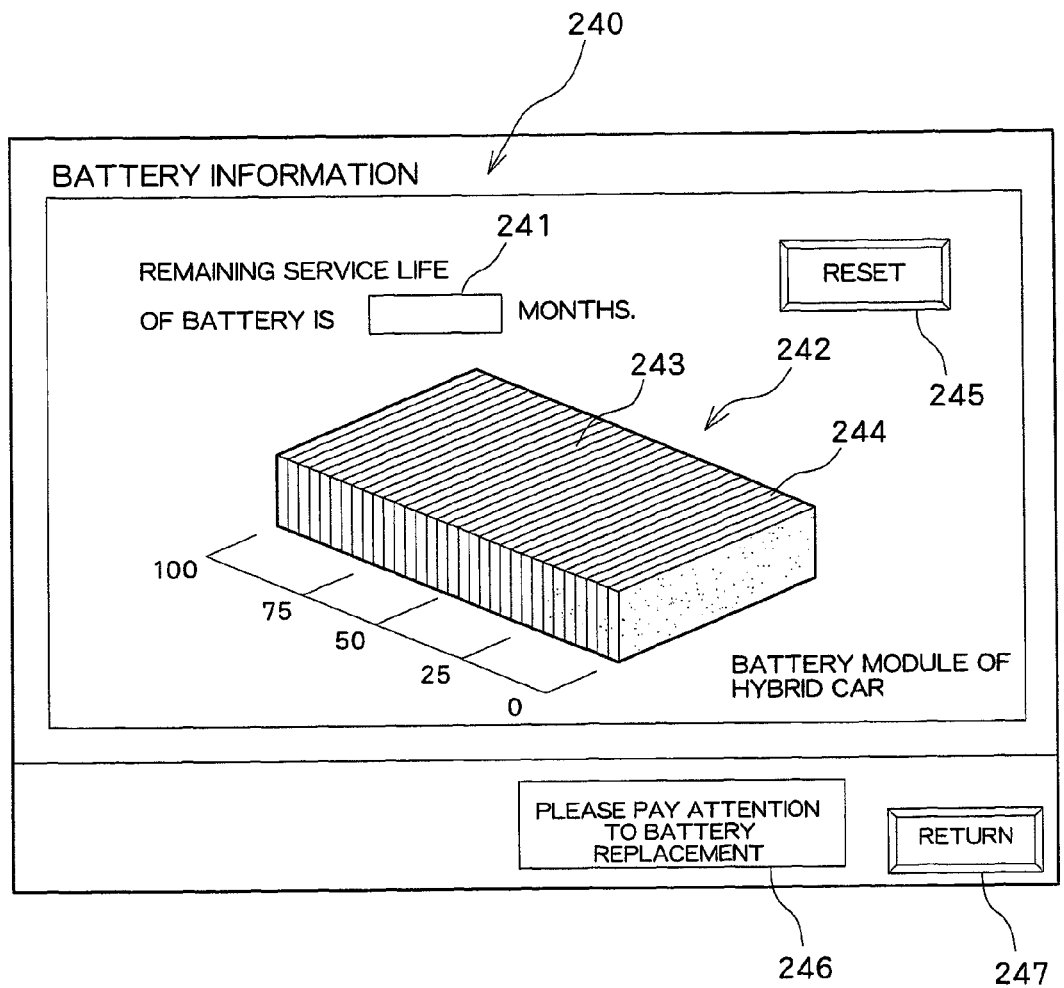
FIG. 4 is an explanatory view showing one embodiment of second display means of the battery service life display means.

FIG. 4 shows one embodiment of second display means of the battery service life display means 2. With regard to the second display means, in the first display means (FIG. 2 or 3), a screen switch button 47, 147 in this energy monitor screen 40 or the constitution screen 140 of the hybrid system is pressed, whereby the screen is switched and displayed by the service life display control means 4. Alternatively, the battery 45, 145 in the screen may directly be touched to switch the screen. In the present embodiment, a battery information screen 240 displays a column 241 in which a remaining service life of the battery 16 is displayed as a numeric value (in units months); an area 243 which is not colored and an area 244 provided with the same color as that of the display of the warning, the areas configured to indicate the present numeric value in a case where it is assumed that the battery service life is 100 in a perspective view of a battery module 242; and a button 245 which resets after each battery replacement. With this display, the driver's understanding of the condition of the battery (cell) is enhanced. Moreover, outside a frame of this battery information screen 240, a column of a message 246 of the warning and a screen switch button 247 are provided in the same manner as in the first display means.

Here, a method of estimating the information on the service life of the battery 16 displayed by the battery service life display means 2 will be described. The information on the service life of the battery 16 is estimated by a battery service life estimation unit 11. The battery service life estimation unit 11 calculates and accumulates a degree of influence on degradation with an elapse of time, organized for each factor that influences the battery degradation, as a degree (D) of the battery degradation from vehicle specifications data 9, and data measured by measuring units 5, 6, 7 and 8 and recorded in a storage unit 10 every constant period, for example, environment data on the battery 16, power consumption data on electric components 17, and vehicle travel data including drive operation data, based on battery degradation data measured from a vehicle travel test 19 and stored in a degradation data storage unit 13. Furthermore, a useful life of the battery 16 is estimated from the accumulated degrees of influence, and the level of the warning on the service life of the battery 16 and the remaining service life are calculated from the number of years the battery has been operated up to that point.

The environment data on the battery 16 is data of measurements of factors which influence the degradation of the battery itself such as, for example, a temperature and a humidity of the battery 16 of the hybrid vehicle. The battery 16 is controlled so that a charge amount and a discharge amount of the battery fall within a constant capacity range. This is because when the charge amount and the discharge amount increase, battery performance deteriorates, especially when the battery is overcharged and over-discharged. Additionally, the battery 16 generates heat as a result of increases in the charge amount and the discharge amount. Therefore, the temperature of the battery 16 or an ambient temperature are factors which influence the useful life of the battery itself.

The power consumption data on the electric components 17 is a power consumption of an air conditioner carried in the vehicle, and other electric components 17 such as a sound system, a display, a heater, or navigational equipment installed on the vehicle, and the power consumption influences the calculated useful life of the battery 16. These electric components 17 are charged with a 12 V auxiliary battery, in which a voltage of the above-mentioned high-pressure battery 16 of 144 V to 288 V is lowered using a DC/DC converter, and power is supplied from this auxiliary battery to the electric components.

The data on vehicle travel includes travel distance data, travel vehicle speed data, and the like. This data, which shows influences on the useful life of the battery 16, is measured from the travel motor 18. The drive operation data is driver handling operation data for recognizing the travel pattern of the vehicle, foot brake operation data, and accelerator operation data, as measured by a handling operation monitor 20, a foot brake operation monitor 21, and an accelerator operation monitor 22, respectively. However, to estimate the battery service life of the hybrid vehicle, other data, such as measured data on control of the gasoline engine and the electric motor, may be included.

The vehicle specifications data 9 includes data on the vehicle weight and model and specifications such as types and capacities the installed engine, air conditioner, or electric components 17. These data are determined by standard specifications and options at a time of purchase of the vehicle type, and is recorded in the storage unit 10 at the time of purchase of the vehicle. When the options are added or changed after the purchase of the vehicle, the data is written in the storage unit 10 and updated.

Figure 5:
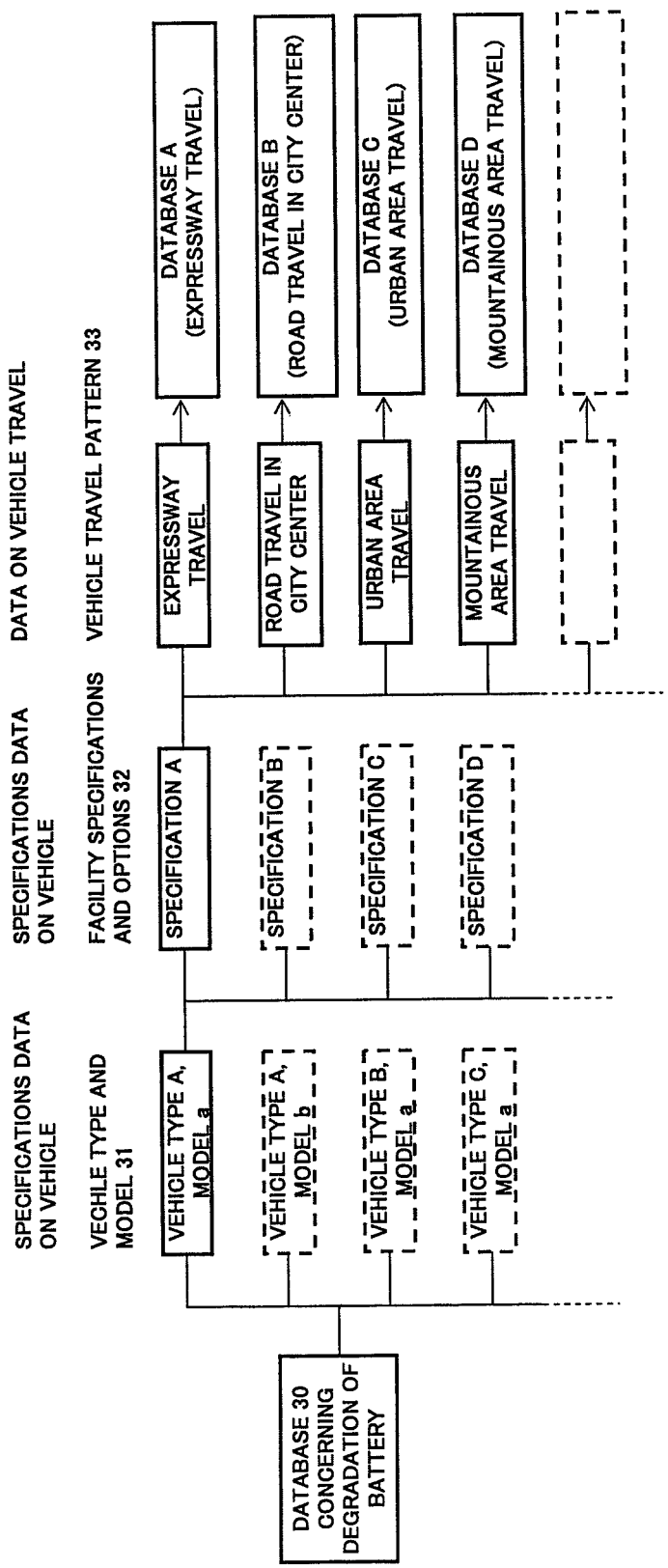
FIG. 5 is an explanatory view of one example of a database concerning battery degradation in each vehicle travel pattern, which has been extracted from a vehicle travel test result.

Based on the results of vehicle travel testing, a database concerning the battery degradation is stored in the degradation data storage unit 13. That is, a database concerning the battery degradation of the hybrid vehicle is integrated based on results of a travel test of an actual vehicle, a performance evaluation system of a power output device and the like, and stored. FIG. 5 shows one example of a database 30 related to battery degradation. First, this database 30 is constituted so as to be classified into databases of vehicle types and models 31. The vehicle types and models 31 are constituted so as to be classified into facility specifications and options 32. In this case, it is assumed that standard facility specifications of the vehicle type are only carried, and the option of the facility specifications may be the corrected database 30. Subsequently, the database of the vehicle is constituted so as to be classified into databases of vehicle travel patterns 33. Then, from the measured results of the travel test of the actual vehicle, the performance evaluation system of the power output device and the like, databases A, B, C, D . . . are extracted with respect to a proceeding situation of the battery degradation and the useful life in the vehicle travel pattern 33. Here, the vehicle travel pattern 33 is classified by differences of travel conditions such as expressway travel, road travel in the center of a city, urban area travel, and mountainous area travel. Each of the vehicle travel patterns 33 is further finely classified. For example, the expressway travel is classified into usual travel and traffic jam travel, and the road travel in the center of the city is classified into usual travel and traffic jam travel. The travel may further finely be classified in this manner according to road congestion conditions.

Figure 6:
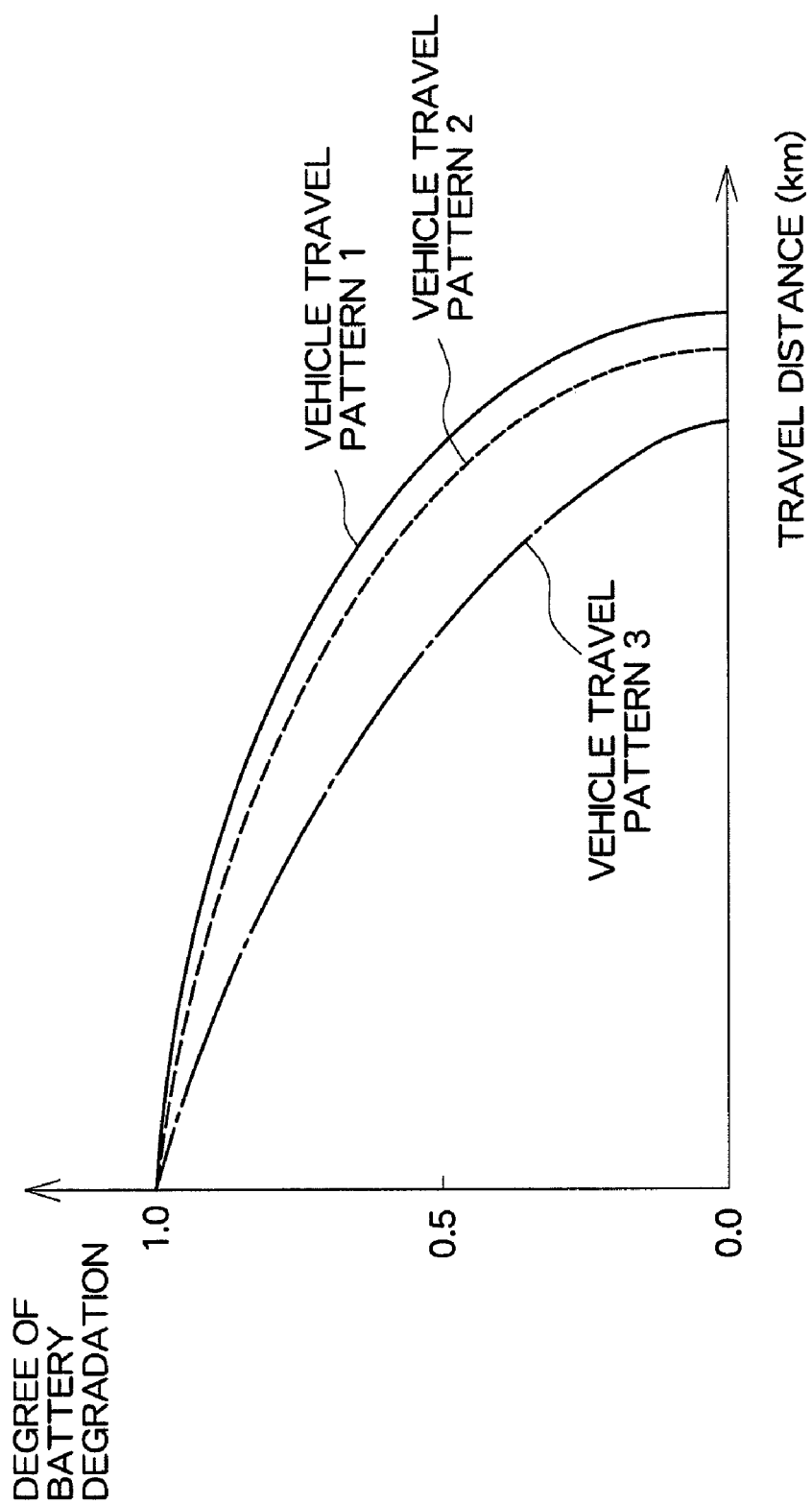
FIG. 6 is an explanatory view of one example of a database indicating a degree of the battery degradation for each vehicle travel pattern.

FIG. 6 shows an explanatory view of one example of the database 30 extracted from the vehicle travel test results and indicating the degree of the battery degradation for the respective vehicle travel patterns 33. This database 30 is illustrated as a graph of the degree of the battery degradation with a travel distance for the respective vehicle travel patterns 33. Here, it is assumed that the degree of the battery degradation at the start of actual travel of the vehicle is 1.0 and that the degree of the battery degradation at a point when the battery must be replaced is 0.0. A curve of each vehicle travel pattern 33 is extracted from the vehicle travel test result and idealized. Here, an extended travel time at a time when the degree of the battery degradation is 0.0 is calculated for each vehicle travel pattern 33. A value obtained by dividing the extended travel time by a presumed value of an annual travel distance is the useful life of the battery 16. The presumed value of this annual travel distance is calculated from the annual travel distance measured by the actual travel. As the number years the vehicle is used increases, the precision of the presumed value increases. In the database 30 according to the present embodiment, the environment data on the battery 16 is, for example, the degree of the battery degradation based on the travel distance with respect to a temperature and a humidity of the battery 16. The power consumption data on the electric components indicates the degree of the battery degradation based on the travel distance with respect to the power consumption. From these databases 30, the degree of the battery degradation with each useful life of the battery 16 and each travel time is set for each factor that influences the battery degradation.

Here, the battery service life estimation unit 11 calculates the degree of the battery degradation for each vehicle travel pattern 33 from the measurement result of the travel test stored in the degradation data storage unit 13. This is because the influence on the service life of the battery 16 differs according to vehicle travel pattern 33. For example, during travel along an expressway, the number of times of drive operations such as cornering, starting and stopping using the electric motor as the power source is small, and ratios of medium-speed low-load travel having a satisfactory engine efficiency and accelerated travel with the engine assisted by the electric motor are large. On the other hand, during traveling in the center of a city, the medium-speed low-load travel having satisfactory engine efficiency is performed less frequently, and the number of instances of operations such as cornering, starting, and stopping by use of the electric motor as the power source increases. During deceleration, the battery 16 is repeatedly charged by regenerative braking. Therefore, each of the vehicle travel patterns is evaluated, so that the remaining service life can be precisely estimated ("presumed").

The battery service life estimation unit 11 calculates a value from the database 30 stored in the degradation data storage unit 13 by multiplying an inverse (1/T) of the useful life (T) of the battery 16 in the case of continuous travel in the recognized vehicle travel pattern 33 by a constant period tn (n=1, 2, 3 . . . ) and further by a correction coefficient αn (n=1, 2, 3 . . . ). A value (tn/T) obtained by multiplying the inverse number of the useful life by the constant period indicates a generation ratio of the battery degradation for the constant period with respect to the useful life of the battery 16. This correction coefficient αn is a coefficient for performing correction when the degree of the battery degradation in the vehicle travel pattern 33 does not decrease at a constant ratio with respect to a time axis. As shown in FIG. 6, this coefficient is determined using a curve extracted and idealized from a battery degradation table obtained from the travel testing. Therefore, this calculated value (αn×tn/T) indicates the degree (dn (n=1, 2, 3 . . . )) of the battery degradation for the constant period. Furthermore, a value D (=d1+d2+d3+ . . . dn=α1×t1/T+α2×t2/T+α3×t3/T+ . . . αn×tn/T) obtained by accumulating the degree (dn) of the battery degradation in each vehicle travel pattern 33 recognized every constant time from the start of the actual travel of the vehicle indicates the degree of the battery degradation up to the time (n). From this accumulated value D, a remaining service life R of the battery 16 is represented by R=1−D.

Moreover, the battery service life estimation unit 11 integrates a degree (Db) of the battery degradation based on the data on the vehicle travel in the recognized vehicle travel pattern 33, a degree (Da) of the battery degradation calculated from the environment data on the battery 16, and a degree (Dc) of the battery degradation calculated from the consumption data on the electric components to obtain a value D of the accumulated degree of the battery degradation. In a case wherein the database 30 based on the measurement result of the travel test is set such that the degrees of battery degradation due to these factors are added up to obtain a general degree of the battery degradation, D=(Db+Da+Dc) is set. In another embodiment, based on the degree (Db) of the battery degradation based on the data on the vehicle travel in the vehicle travel pattern 33, the degree (Da) of the battery degradation calculated from the environment data on the battery 16 and the degree (Dc) of the battery degradation calculated from the consumption data on the electric components may be used as correction values.

The degree (D) of battery degradation based on these data is obtained by accumulating the degrees (Db, Da and Dc) of battery degradation in the respective vehicle travel patterns 33 calculated at constant intervals from the start of the actual travel of the vehicle by the above-mentioned method, to indicate the degree of the battery degradation up to the time (n). Therefore, the remaining service life R of the battery 16 is represented by (R=1−D).

(Travel Fuel Consumption Display Means)

The travel fuel consumption display means 3 displays information on travel fuel consumption. In the present embodiment, this display includes two types of means: first display means for displaying a level of a warning on a degree of degradation of the travel fuel consumption due to the battery degradation in each drive pattern; and second display means for displaying the degree of degradation of the travel fuel consumption due to the battery degradation in each drive pattern.

Figure 7:
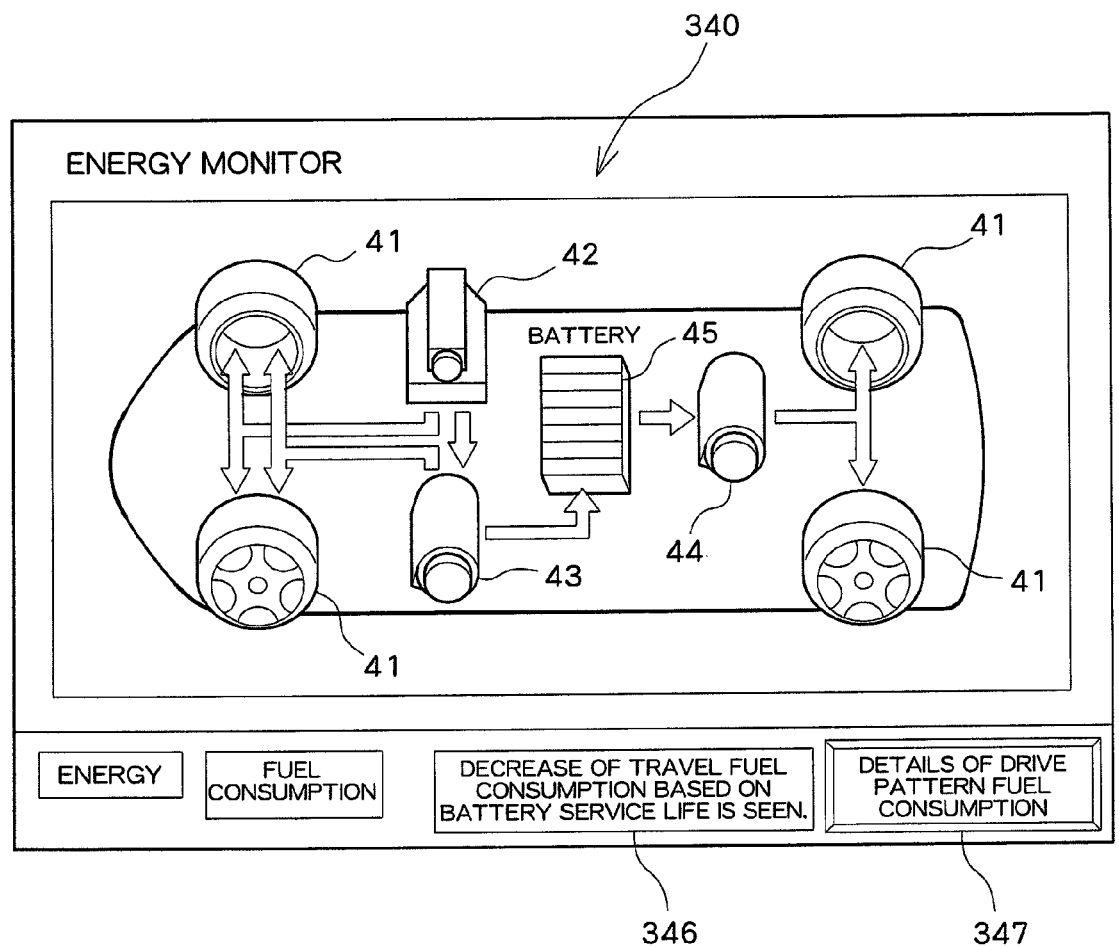
FIG. 7 is an explanatory view showing one embodiment of first display means of travel fuel consumption display means.

FIG. 7 shows one embodiment of the travel fuel consumption display means. In the present embodiment, first display means of the travel fuel consumption display means 3 is displayed in an energy monitor screen 340 in the same manner as in the battery service life display means 2 shown in FIG. 2. Here, elements similar to those shown in FIG. 2 are denoted with the same reference numerals.

With regard to the first display means, in a frame of a diagram showing the battery (cell) 45 in this energy monitor screen 340, the color of the display changes to green (the travel fuel consumption based on the battery service life is normal), yellow (there is a decrease of the travel fuel consumption based on the battery service life), or red (the decrease of the travel fuel consumption based on the battery service life is abnormal) in accordance with the level of the warning on the degree of degradation of the travel fuel consumption based on the battery service life. Moreover, a column for a message 346 of the warning is provided outside the frame of the energy monitor screen 340, and content of the warnings are displayed there in conjunction with the color of the battery (cell) 45. When the color is green, a message "the travel fuel consumption based on the battery service life is normal" is displayed. In the case of yellow, a message "a decrease of the travel fuel consumption based on the battery service life is seen". In the case of red, a message "the decrease of the travel fuel consumption based on the travel battery service life is abnormal" is displayed. The information on the degree of degradation of the travel fuel consumption based on the battery service life is displayed in the energy monitor screen 340 in this manner, so that the driver can comprehend the presence of the battery 16 in the hybrid system. Moreover, the level of the warning is displayed in color, so that the driver can appropriately recognize the information concerning the battery 16. Furthermore, even when the travel fuel consumption is normal, the message is displayed, so that the driver's attention to the battery 16 can be enhanced.

Figure 8:
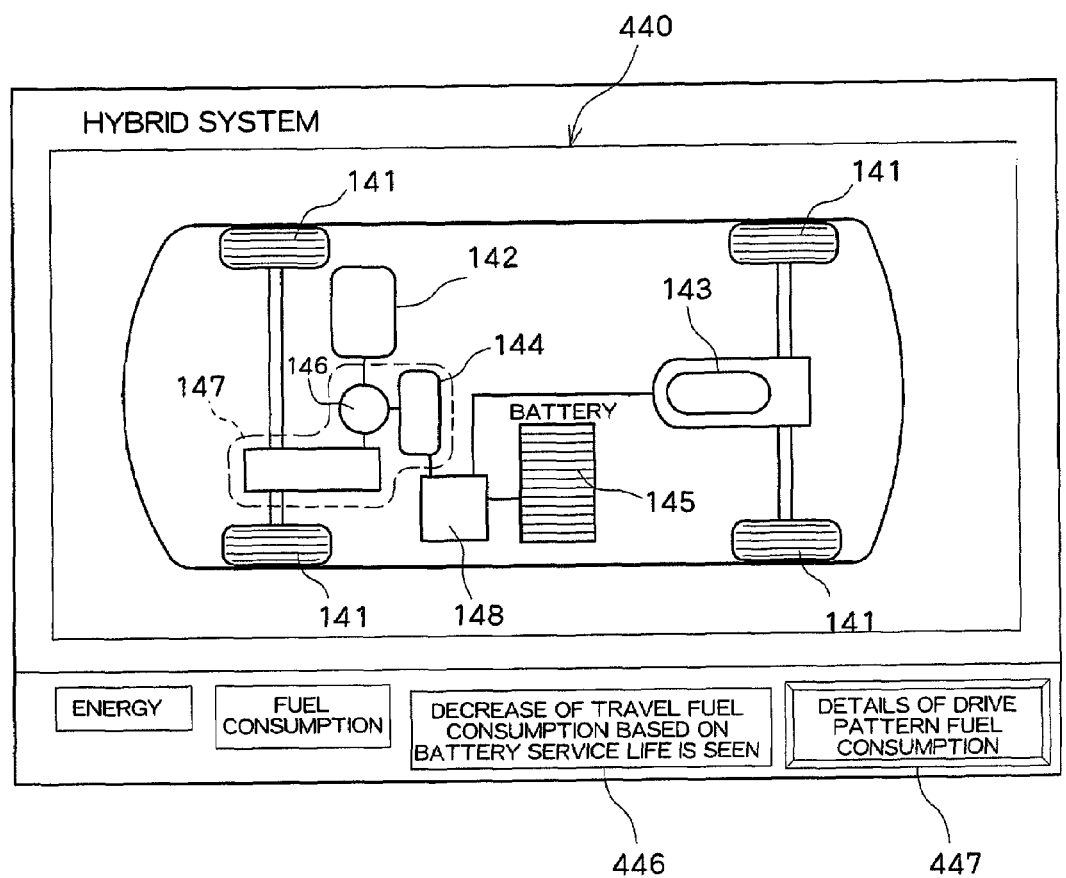
FIG. 8 is an explanatory view showing another embodiment of the first display means of the travel fuel consumption display means.

FIG. 8 shows another embodiment of the first display means. Here, in the same manner as in FIG. 3, a screen 440 showing a constitution of a hybrid system is used as a screen showing the hybrid system. Here, elements similar to those of FIG. 3 are denoted with the same reference numerals. According to this embodiment, in the same manner as in the above embodiment, in a frame of a diagram showing a battery (cell) 145 in the screen 440 showing the constitution of the hybrid system, the color of the display changes to green (the travel fuel consumption based on the battery service life is normal), yellow (there is a decrease of the travel fuel consumption based on the battery service life), or red (the decrease of the travel fuel consumption based on the battery service life is abnormal) in accordance with the level of the warning on the degree of degradation of the travel fuel consumption based on the battery service life. Moreover, a similar message is displayed in a column for a warning message 446.

Figure 9:
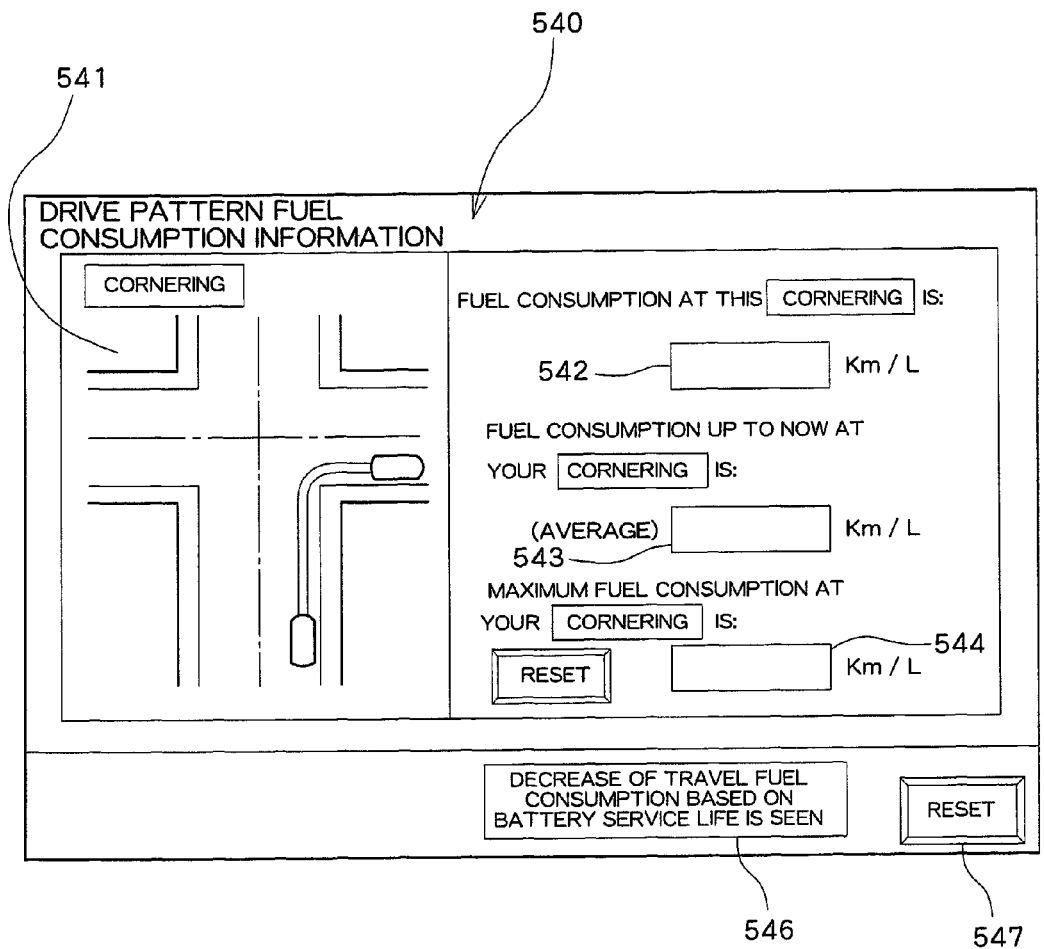
FIG. 9 is an explanatory view showing one embodiment of second display means of the travel fuel consumption display means.

FIG. 9 shows one embodiment of the second display means. With regard to the second display means, in the first display means (FIG. 7 or 8), a screen switch button 347, 447 in this energy monitor screen 340 or the constitution screen 440 of the hybrid system is pressed, whereby the screen is switched by the fuel consumption display control means 24 to display the second display means. Alternatively, the images of the battery 45, 145 displayed on the screen may be directly touched to switch the screen display. In the present embodiment, a drive pattern fuel consumption information screen 540 includes a screen 541 which shows a drive pattern. FIG. 9 shows a diagram of cornering of the vehicle as one example. In this case, there is shown a start point or an end point of the cornering of the vehicle, or drive operation information such as a travel track of the vehicle. As this diagram, a schematic diagram beforehand prepared for each drive pattern may be used, or actual map information in conjunction with car navigation may be used. Moreover, the diagram shows a travel fuel consumption 542 measured in the drive pattern, an average value 543 of the driver's past travel fuel consumption in the drive pattern, and a maximum value 544 of the driver's past travel fuel consumption in the drive pattern. In addition, outside the frame of this drive pattern fuel consumption information screen 540, a column 546 for a warning message and a screen switch button 547 are provided in the same manner as in the first display means.

The driver can see, for each of their drive patterns, the short-term fuel consumption of each drive pattern. Moreover, the measured travel fuel consumption can be compared with the driver's past average value and maximum value in the drive pattern. According to this display, the driver can attempt to improve their drive operation skills. Because the driver of the hybrid vehicle is then concerned with satisfactory travel fuel efficiently as a characteristic of the hybrid vehicle, when the driver can see the influence of their driving operation on the vehicle fuel consumption, they are better able to enjoy the drive itself. Then, the decrease of the travel fuel consumption due to the battery degradation is displayed on the screen, so that the information on the battery 16 can appropriately be recognized, and the attention to the battery 16 can be enhanced. In the display of this drive pattern fuel consumption information 540, for example, the ratio of the travel fuel consumption due to the battery degradation may be displayed as a factor for the decrease of the travel fuel consumption. Moreover, the maximum value (test travel fuel consumption data) of the travel fuel consumption by a professional drivers which is called "champion data", may be included.

Here, a method of evaluating the information on the travel fuel consumption of the battery 16 displayed by the travel fuel consumption display means 3 will be described. The information on the travel fuel consumption of the battery 16 is evaluated by a travel fuel consumption evaluation unit 12 shown in FIG. 1. The travel fuel consumption evaluation unit 12 compares actual travel fuel consumption data of each drive pattern measured by the vehicle travel data measuring unit 8 with the test travel fuel consumption data of the drive pattern stored in a fuel consumption data storage unit 14 based on the test travel fuel consumption data obtained from the vehicle travel test 19, set for each drive pattern and stored in the fuel consumption data storage unit 14, and the travel fuel consumption evaluation unit evaluates the degree of the battery degradation from the degree of degradation of the travel fuel consumption set for each degree of the battery degradation for each drive pattern.

Here, the drive pattern is a specific drive pattern such as vehicle cornering, lane changes, starting, or deceleration. The travel fuel consumption in these travel patterns is a travel fuel consumption of gasoline consumed for a measurement period from the start to the end of the pattern. An average fuel consumption, a momentary fuel consumption, a total fuel consumption, a past maximum fuel consumption or the like of a conventional hybrid vehicle is a travel fuel consumption of each unit time obtained by a travel fuel consumption measuring computer 15 as described above, and is not the travel fuel consumption of each drive pattern. Therefore, the vehicle travel data measuring unit 8 receives data on the travel fuel consumption from the travel fuel consumption measuring computer 15, and newly measures the consumption of each drive pattern.

This measurement period from the start to the end is an appropriate period for evaluating characteristics of the travel fuel consumption of each travel pattern. For example, with regard to the cornering of the vehicle and the lane change, the period may be, for example, a period from a time when the steering wheel is turned to a time when the steering wheel is returned, or a period of lighting of a direction indicator lamp such as a turn signal. Moreover, with regard to the start of the vehicle, the period may be, for example, a period from the time when an ignition switch is turned on to the time when a constant travel speed is achieved. Furthermore, with regard to the deceleration, the period may be a period from the start to the end of a braking operation. In addition, this constant period may be set based on an operation of the hybrid system, for example, an operation of a regenerative brake, a charge period of the battery, or the like, and may be used as auxiliary information.

Moreover, the vehicle travel data measuring unit 8 measures the drive operation of each drive pattern of the hybrid vehicle. That is, the unit measures the driver's drive operation for a period in which the actual travel fuel consumption data is measured for each drive pattern, for example, history of a handling operation, a foot brake operation, an accelerator operation, or the like. As shown in FIG. 1, the handling operation monitor 20, the foot brake operation monitor 21, and the accelerator operation monitor 22 transmit the history of each drive operation data to the vehicle travel data measuring unit 8. The vehicle travel data measuring unit 8 puts together these data, and measures the drive operation for the set period. For example, during the cornering of the vehicle, a travel track during the cornering is measured from the vehicle speed, the history of the handling operation or the like. Moreover, during start and deceleration of the vehicle, a start point of acceleration and a start point of the deceleration are measured as data from the histories of the foot brake operation, the accelerator operation, and the like.

In the fuel consumption data storage unit 14, the test travel fuel consumption data is stored from travel fuel consumption data measured during the vehicle travel test 19 conducted for each drive pattern. That is, in a specific drive pattern, such as cornering, lane changes, acceleration, or deceleration, the fuel consumed by the test travel is measured in test travels. The data obtained by this vehicle travel test 19 may be, for example, data measured by a chassis dynamo type travel test facility in an experimental laboratory or data measured by the actual vehicle in the actual travel test. Alternatively, these data may be combined. As this test travel fuel consumption data, more data in which the actual travel and drive operation in the drive pattern are reflected is collected and analyzed, such that the precision of the evaluation of the degree of the battery degradation can thereby be enhanced.

These test travel fuel consumption data are data in which travel conditions in the actual travel are reflected. In the present embodiment, items of the travel conditions are classified in the same manner as in the vehicle travel pattern shown in FIG. 5, and include specific drive patterns such as vehicle cornering, lane changes, staring, and deceleration. Furthermore, the test travel fuel consumption data measured on the respective travel conditions is stored for each drive operation such as the handling operation, the foot brake operation and the accelerator operation.

In the fuel consumption data storage unit 14, the drive operation during the test travel in each drive pattern is measured and stored. These data are similar to those of the drive operation measured by the vehicle travel data measuring unit 8, and description thereof is therefore omitted.

Figure 10:
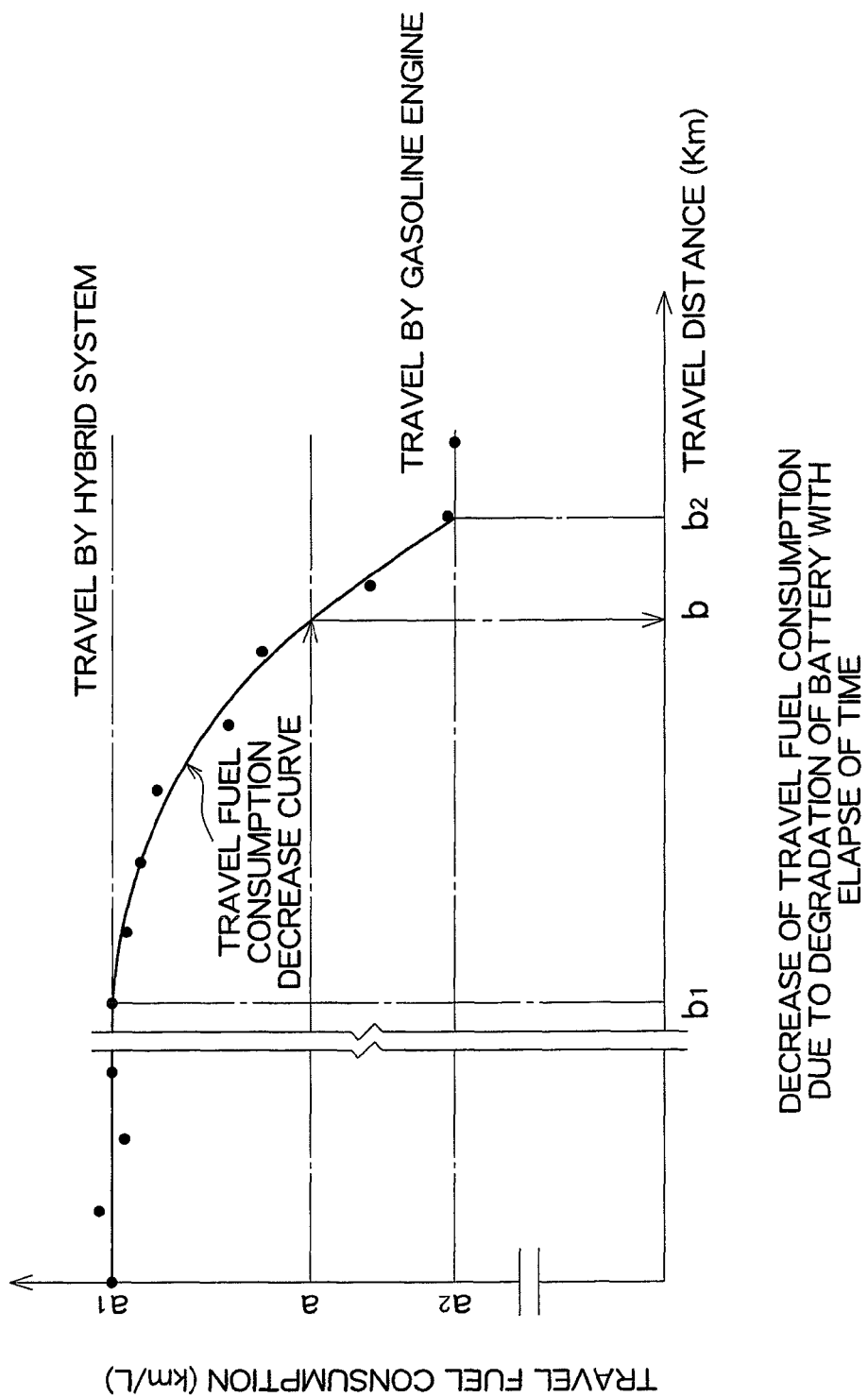
FIG. 10 is a conceptual diagram of a degradation degree of a travel fuel consumption due to degradation of a battery, which has been extracted from test travel fuel consumption data and set.
Figure 11:
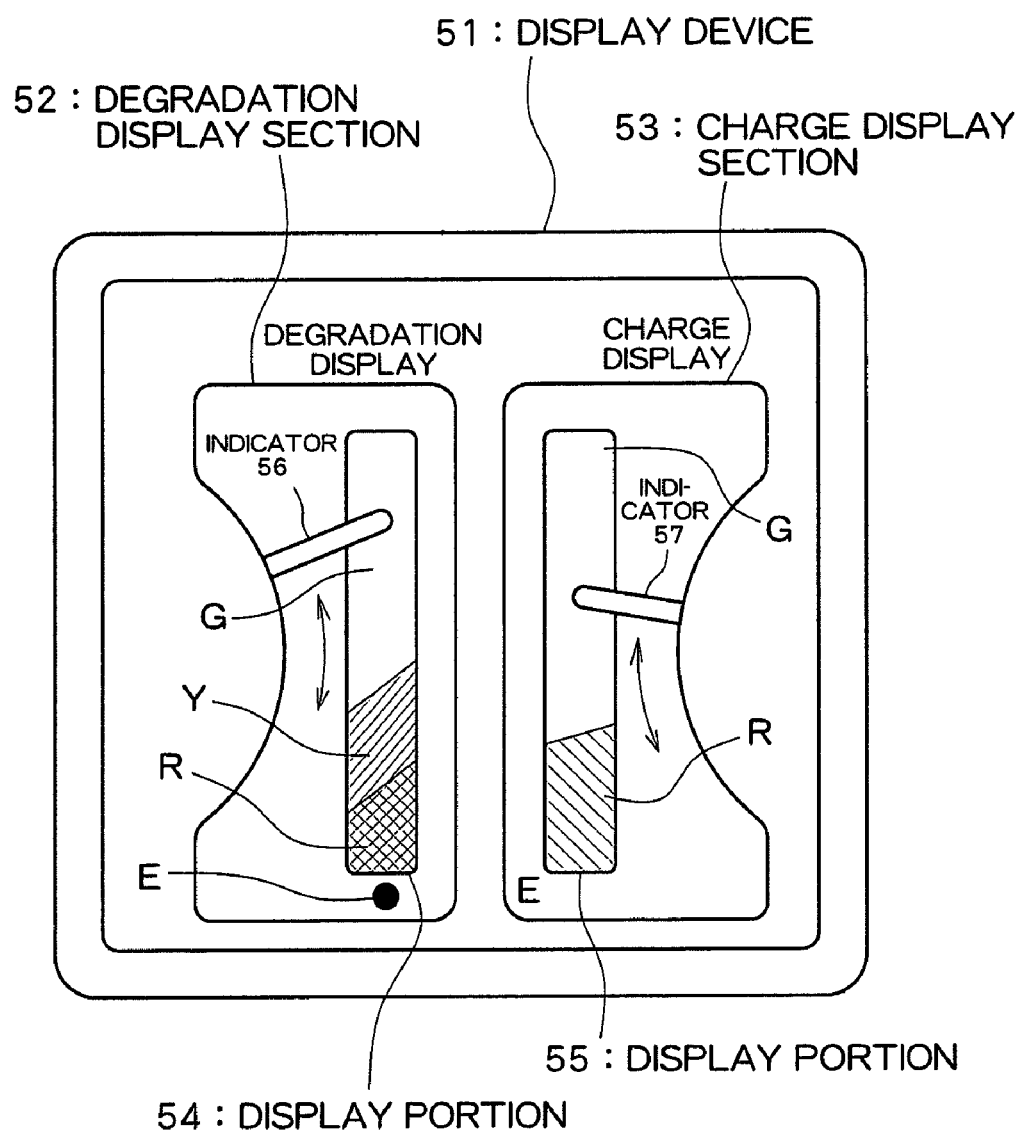
FIG. 11 is a display diagram concerning degradation of a battery according to a conventional technology.
Figure 12:
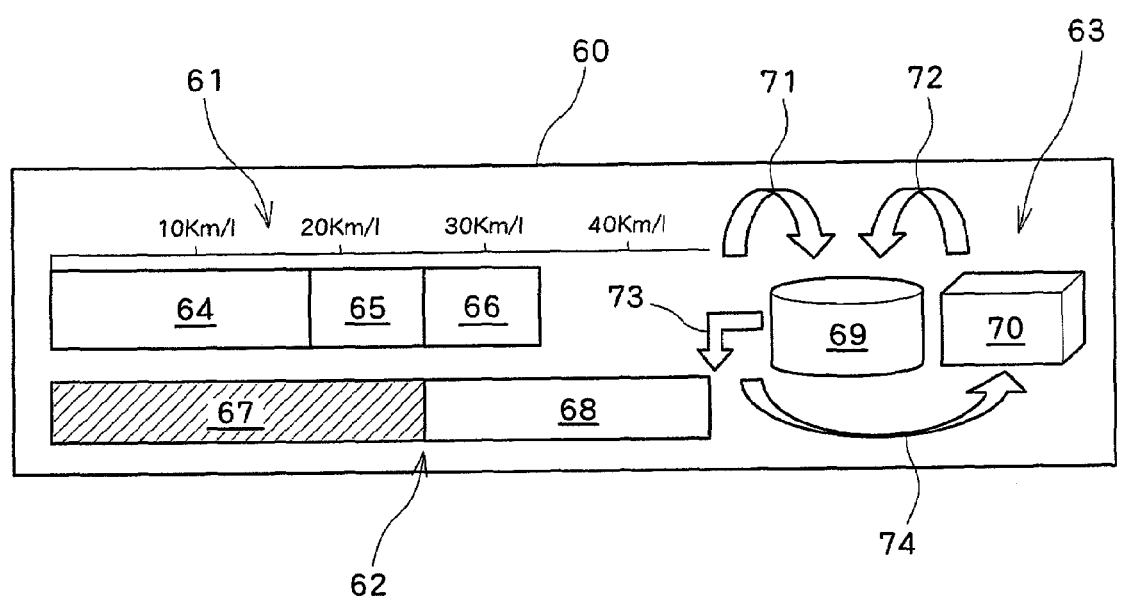
FIG. 12 is a display diagram concerning a travel fuel consumption according to the conventional technology.

FIG. 10 shows a conceptual diagram of the degree of degradation of the travel fuel consumption due to the battery degradation, which has been extracted from the test travel fuel consumption data. Here, the abscissa indicates a travel distance (km), and the ordinate indicates fuel consumption (km/L). In general, before the battery degradation starts, the travel distance of the vehicle fluctuates around a substantially constant value (a1). However, when the vehicle travels in excess of a travel distance (b1), the battery begins to degrade, and the travel fuel consumption decreases while fluctuating. When the hybrid system is operating, that is, in a case where the gasoline engine and the electric motor efficiently operate without any battery degradation, the travel fuel consumption value (a1) and the value (b1) of the travel distance are displayed, while, when the battery 16 degrades and the vehicle travels under power of the gasoline engine alone, a travel fuel consumption value (a2) and a value (b2) of the travel distance re displayed. The travel fuel consumption measured for each degree of the battery degradation decreases from this value a1 to the value a2, when the travel distance increases. The travel fuel consumption evaluation unit 12 extracts a travel fuel consumption decrease curve of each drive pattern from these measured values.

Furthermore, the travel fuel consumption evaluation unit 12 evaluates the driver's driving operation based on historical data of the drive operation in each drive pattern which has been transmitted from the vehicle travel data measuring unit 8. That is, the actual travel fuel consumption data values measured by the vehicle travel data measuring unit 8 fluctuate based on the driver's drive operation, and this fluctuation is considered in a case where the degree of the battery degradation is evaluated by comparison between the actual travel fuel consumption data and the test travel fuel consumption data. For example, if the driver is a new or inexperienced driver, it is likely that the fuel efficiency of their driving operation as evaluated based on the travel track and the history of the travel speed during the cornering will be judged to be poor. Such a reason for decreased fuel efficiency due to driving operation differs from that when the decrease results from battery degradation, and therefore must be excluded from the evaluation. To solve the problem, the degree of degradation of the travel fuel consumption due to the drive operation for each driver's drive operation is preset by the travel fuel consumption evaluation unit 12. When, for example, the travel fuel consumption during the drive operation (the champion data) performed by a person skilled in the drive operation is 1.0, a travel fuel consumption fluctuation of, for example, 1.0 to 0.8 is set. The travel fuel consumption evaluation unit 12 determines the degree of the fluctuation of the travel fuel consumption from the history data of the drive operation during the actual travel in each drive pattern, and compares the actual travel fuel consumption data with the test travel fuel consumption data reduced owing to the set degree of degradation of the travel fuel consumption based on the drive operation. Alternatively, the degree of degradation of the travel fuel consumption based on the drive operation, which has been set in the actual travel fuel consumption data, is considered and compared with the test travel fuel consumption data. As the driver's drive skills enhance, this degree of degradation gradually comes close to 1.0.

The travel fuel consumption evaluation unit 12 evaluates the degree of degradation of the travel fuel consumption from the travel fuel consumption decrease curve of each drive pattern, which has been extracted from the test travel fuel consumption data, based on the travel distance measured by the vehicle travel data measuring unit 8. Furthermore, the unit judges the driver's drive operation from the drive operation history data of each drive pattern measured by the vehicle travel data measuring unit 8, and considers the degree of degradation of the travel fuel consumption due to the drive operation with respect to the above-noted degradation degree of the travel fuel consumption to calculate the degree of degradation of the travel fuel consumption due to the battery degradation. When the degree of degradation of the travel fuel consumption due to this battery degradation exceeds the set value, in the above-mentioned first display means, the message of the warning is displayed in the energy monitor screen 340 or the constitution screen 440 of the hybrid system. To raise the precision, this warning message may be judged with reference to a plurality of times of recording for each drive pattern in the past. Moreover, the second display means arranges and displays the display 542 of the travel fuel consumption in the drive pattern, the display 543 of the past average travel fuel consumption in the drive pattern and the display 544 of the past maximum travel fuel consumption in the drive pattern fuel consumption information screen 540. In consequence, when the drive operation skills are not poor but the travel fuel consumption in the drive pattern continues to decrease with respect to the past average value, the driver can recognize that the cause is degradation of the battery. Alternatively, the degree of degradation of the travel fuel consumption due to battery degradation may be displayed in the drive pattern fuel consumption information screen 540. Furthermore, the test travel fuel consumption data (the champion data) in the drive pattern may be arranged and displayed for the skilled driver.

The invention claimed is:

1. A hybrid vehicle battery information display device arranged on a drive operation board of a hybrid vehicle in which a battery is carried as a power source to display information on a service life of the battery, the hybrid vehicle battery information display device comprising:

battery service life display means for estimating a degree of degradation of the battery with respect to a useful life of the battery from environment data on the battery, power consumption data on electric components and data on vehicle travel which have been measured based on battery degradation data measured from a vehicle travel test, to display a level of warning on the service life of the battery and information on a remaining service life of the battery; and service life display control means for controlling the level of the warning on the service life of the battery and the information on the remaining service life of the battery to display the level and the information in the battery service life display means.

2. The hybrid vehicle battery information display device according to claim 1, wherein the battery service life display means displays the level of the warning on the service life of the battery by use of a screen which shows a hybrid system.

3. The hybrid vehicle battery information display device according to claim 1, wherein the battery service life display means displays the information on the remaining service life of the battery together with a screen which displays the battery.

4. The hybrid vehicle battery information display device according to claim 1, further including travel fuel consumption display means for evaluating, from the vehicle travel test, a degradation degree of an actual travel fuel consumption due to the degradation of the battery for each drive pattern based on test travel fuel consumption data set for each drive pattern, to display the level of the warning on the degradation degree of the travel fuel consumption due to the degradation of the battery for each drive pattern and information on the degradation degree of the travel fuel consumption due to the degradation of the battery for each drive pattern; and fuel consumption display control means for controlling the level of the warning on the degradation degree of the travel fuel consumption due to the degradation of the battery for each drive pattern and the information on the degradation degree of the travel fuel consumption due to the degradation of the battery for each drive pattern, to display the level and the information in the travel fuel consumption display means.

5. The hybrid vehicle battery information display device according to claim 4, wherein the travel fuel consumption display means displays the level of the warning on the degradation degree of the travel fuel consumption due to the degradation of the battery for each drive pattern by use of a screen which shows a hybrid system.

6. The hybrid vehicle battery information display device according to claim 4, wherein the travel fuel consumption display means displays the information on the degradation degree of the travel fuel consumption due to the degradation of the battery for each drive pattern together with a screen which shows the drive pattern.

7. The hybrid vehicle battery information display device according to claim 4, wherein the drive pattern includes cornering of the vehicle, lane change of the vehicle, starting of the vehicle, and deceleration of the vehicle.

8. The hybrid vehicle battery information display device according to claim 4, wherein the service life display control means allows the service life display means to switch a screen which displays the level of the warning on the service life of the battery and a screen which displays the information on the remaining service life of the battery, and the fuel consumption display control means allows the travel fuel consumption display means to switch a screen which displays the level of the warning on the degradation degree of the travel fuel consumption due to the degradation of the battery for each drive pattern and a screen which displays the information on the degradation degree of the travel fuel consumption for each drive pattern.

9. The hybrid vehicle battery information display device according to claim 4, wherein the screen of the battery service life display means which displays the level of the warning on the service life of the battery and the screen of the travel fuel consumption display means which displays the level of the warning on the degradation degree of the travel fuel consumption due to the degradation of the battery for each drive pattern are initial screens.

10. The hybrid vehicle battery information display device according to claim 1, wherein the level of the warning is distinguished by colors.

11. The hybrid vehicle battery information display device according to claim 1, wherein the colors are green, yellow and red.

* * * * *